United States Patent [19]

Carlsten et al.

[11] Patent Number: 5,283,715
[45] Date of Patent: Feb. 1, 1994

[54] INTEGRATED HEAT PIPE AND CIRCUIT BOARD STRUCTURE

[75] Inventors: Ronald W. Carlsten; Sung J. Kim; Alan L. Murphy, all of Tucson, Ariz.

[73] Assignee: International Business Machines, Inc., Armonk, N.Y.

[21] Appl. No.: 953,080

[22] Filed: Sep. 29, 1992

[51] Int. Cl.⁵ .............................................. H05K 7/20
[52] U.S. Cl. .................................. 361/702; 174/15.2; 165/104.33; 257/715; 361/796
[58] Field of Search ...................... 361/382, 385–388, 361/415, 699, 700, 701, , 702, 796; 165/104.26, 104.33, 80.4; 174/15.2, 252; 257/714, 715; 62/259.2

[56] References Cited

U.S. PATENT DOCUMENTS

| | | | |
|---|---|---|---|
| 4,327,399 | 4/1982 | Sasaki et al. | 361/385 |
| 4,631,636 | 12/1986 | Andrews | 361/385 |
| 4,706,164 | 11/1987 | L'Henaff et al. | 361/382 |
| 4,718,163 | 1/1988 | Berland et al. | 29/837 |
| 4,727,455 | 2/1988 | Neidig et al. | 361/385 |
| 4,739,443 | 4/1988 | Singhdeo | 361/382 |
| 4,774,630 | 9/1988 | Reisman et al. | 361/383 |
| 4,931,905 | 6/1990 | Cirrito | 361/385 |
| 5,179,500 | 1/1993 | Koubek | 361/385 |

FOREIGN PATENT DOCUMENTS

54-078670 6/1979 Japan.
1-286395 11/1989 Japan.

OTHER PUBLICATIONS

Anacker, "Liquid Cooling . . . Chips", IBM Tech Discl Bull vol. 20 No. 9 Feb. 1978, p. 3742.
Kerjilian, "Heat-Pipe . . . Package", IBM Tech Discl Bull vol. 18 No. 12 May 1976, p. 3982.

*Primary Examiner*—Gerald P. Tolin
*Attorney, Agent, or Firm*—Greenlee and Winner

[57] ABSTRACT

A heat pipe structure is incorporated directly into the metal baseplate of a circuit card thereby eliminating thermal contact resistance between the baseplate and the heat pipe assembly. Components are mounted on a copper circuit layer bonded to a dielectric layer in a first portion of the baseplate with a second portion of the baseplate/heat pipe assembly extending into a heat sink/cold plate condensing area for removal of heat generated in the component portion.

9 Claims, 2 Drawing Sheets

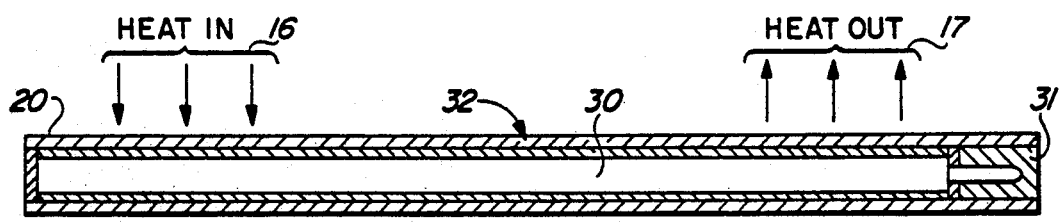
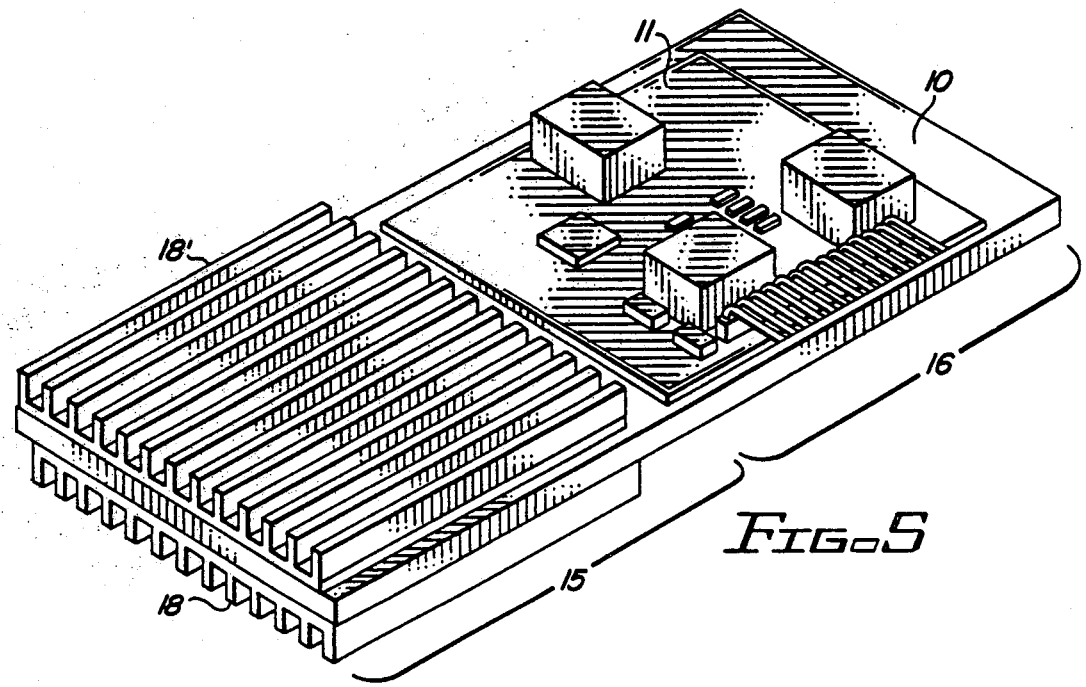
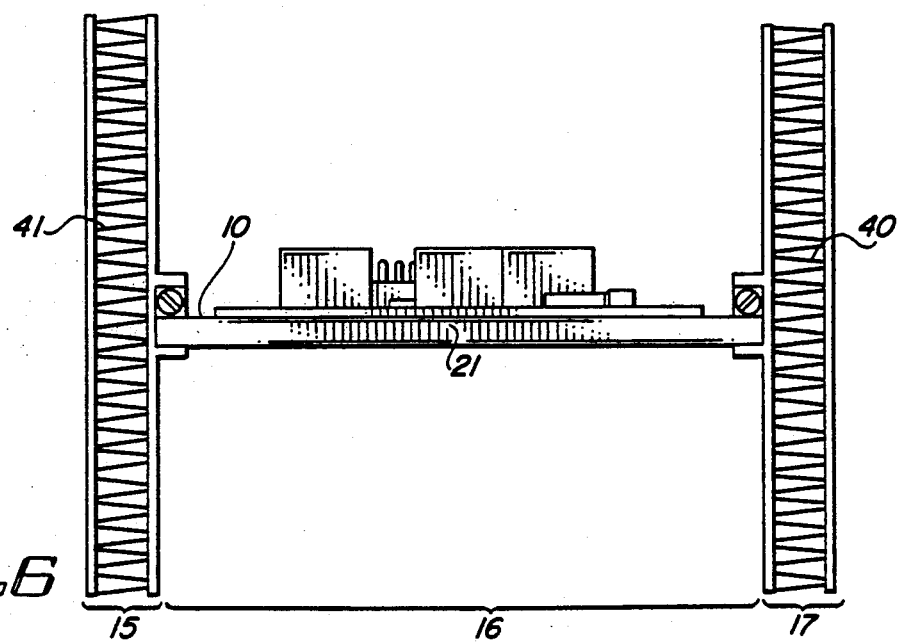

INTEGRATED HEAT PIPE AND CIRCUIT BOARD STRUCTURE

This invention relates to the cooling of circuit boards and, more particularly, to the cooling of metal-backed circuit boards with surface mounted components.

BACKGROUND OF THE INVENTION

Some electronic circuits generate an unusually large amount of heat such as those circuits that are used in power supplies. Metal-backed circuit boards are frequently used in such applications, and are often designed for surface-mounted components and direct chip-attached components. Normally these cards are cooled by air convection, frequently by forced air directed across the surface of the circuit board. However, as the need to further miniaturize power supplies and other unusually high heat-generating applications becomes a significant design issue, cards which are cooled by air convection become unsatisfactory. Hot spots under components may be generated and either the size of the metal-backed printed circuit board must increase for better heat dissipation or the life of the components will decrease.

To solve the above-stated problem, the inventors herein have incorporated a flat heat pipe directly into the copper layer of the metal-backed card, thereby eliminating hot spots and enabling the delivery of significantly more power by a given card because of increased cooling capacity. Additionally, longer component life is provided by maintaining all components at approximately the same temperature. Smaller form factor cards are made possible through the improved cooling arrangement. These improvements are accomplished by incorporating a heat pipe at the copper layer thereby eliminating thermal contact resistance between the circuit board and the heat pipe as compared to previous arrangements where heat pipes are attached to cards in an external manner.

Japanese patent application 286395 relates to the use of small heat pipes located between two "prepregs" with a printed board located on the opposite side of the prepreg from the heat pipes. Thus, a laminated assembly is provided with heat pipes ensconced within the prepregs and not directly connected to the circuit board itself.

U.S. Pat. No. 4,727,455 relates to a semi-conductor power module with an integrated heat pipe. Semi-conductor power components are located in openings formed in a ceramic carrier plate. Heat pipes are integrated into the structure between the ceramic carrier plate and a ceramic baseplate.

U.S. Pat. No. 4,327,399 relates to a cooling arrangement for integrated circuit chips in which a heat pipe structure is located within the ceramic or silicon substrate.

Japanese patent application 54-78670 also relates to a ceramic heat pipe incorporated into the substrate of components.

SUMMARY OF THE INVENTION

Briefly stated, this invention provides for the incorporation of one or more encapsulated heat pipes into a structure with the metal baseplate of an integrated circuit card. In that manner, the metal baseplate of the card is integrated with the heat pipe. The components of the circuit card are located on a portion of the heat pipe baseplate assembly, with a portion of the heat pipe baseplate assembly extending beyond the periphery of the component portion into a cooling region where heat can be dissipated in a heat sink or cold plate arrangement.

BRIEF DESCRIPTION OF THE DRAWING

FIG. 4 is a diagram for explaining heat pipe operation.

FIGS. 5 and 6 show alternative cooling arrangements for the integrated circuit board/heat pipe structure.

DETAILED DESCRIPTION

Figure 1:
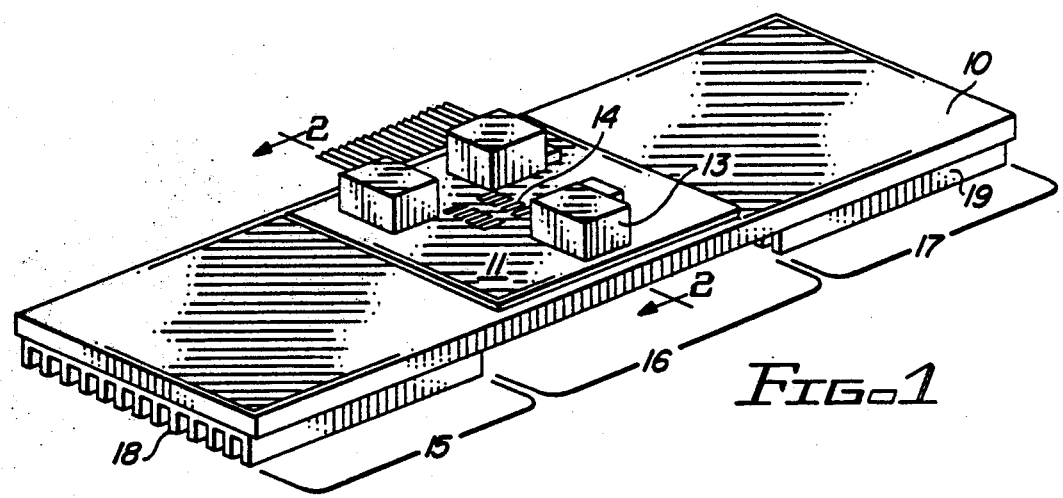
FIG. 1 shows an external view in perspective of the circuit board/heat pipe assembly of the instant invention.

When reference is made to the drawing, like numerals will indicate like parts and structural features in the various figures.

Figure 2:
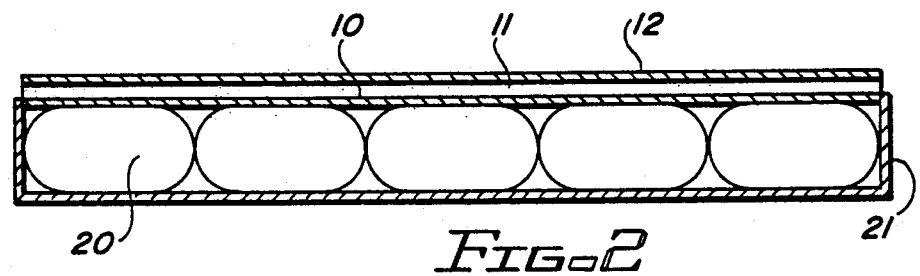
FIG. 2 is a sectional view taken along the line 2—2 n FIG. 1 showing one type of heat pipe structure.

FIG. 1 is a perspective view of the circuit board heat pipe assembly of the invention. FIG. 2 is a sectional view taken along the line 2—2 in FIG. 1 showing the interior of the heat pipe. The circuit board is comprised of a copper baseplate 10 with a thermally conductive dielectric layer 11 bonded to baseplate 10 in the portion of the baseplate upon which components are mounted. A copper circuit layer 12, shown in FIG. 2 is placed over the thermally conductive dielectric layer, and etched to provide lands for electrically connecting surface-mounted components such as components 13 and 14. FIG. 1 shows that the copper baseplate 10 extends considerably beyond the baseplate portion in which the surface mounted components are located. In the configuration of FIG. 1, baseplate 10 extends in two directions, along two sides, in order that heat generated in the components 13 and 14 located over the evaporator section 16 can be dissipated in the condensor sections 15 and 17. Cooling fins 18 and 19 are provided over which cooling fluid can pass to remove heat from the circuit card/heat pipe assembly.

In the sectional view shown in FIG. 2, a series of heat pipes 20 are shown directly underlaying the copper baseplate 10 which forms the top of the heat pipe assembly. The series of heat pipes 20 are held within a frame 21.

Figure 3:
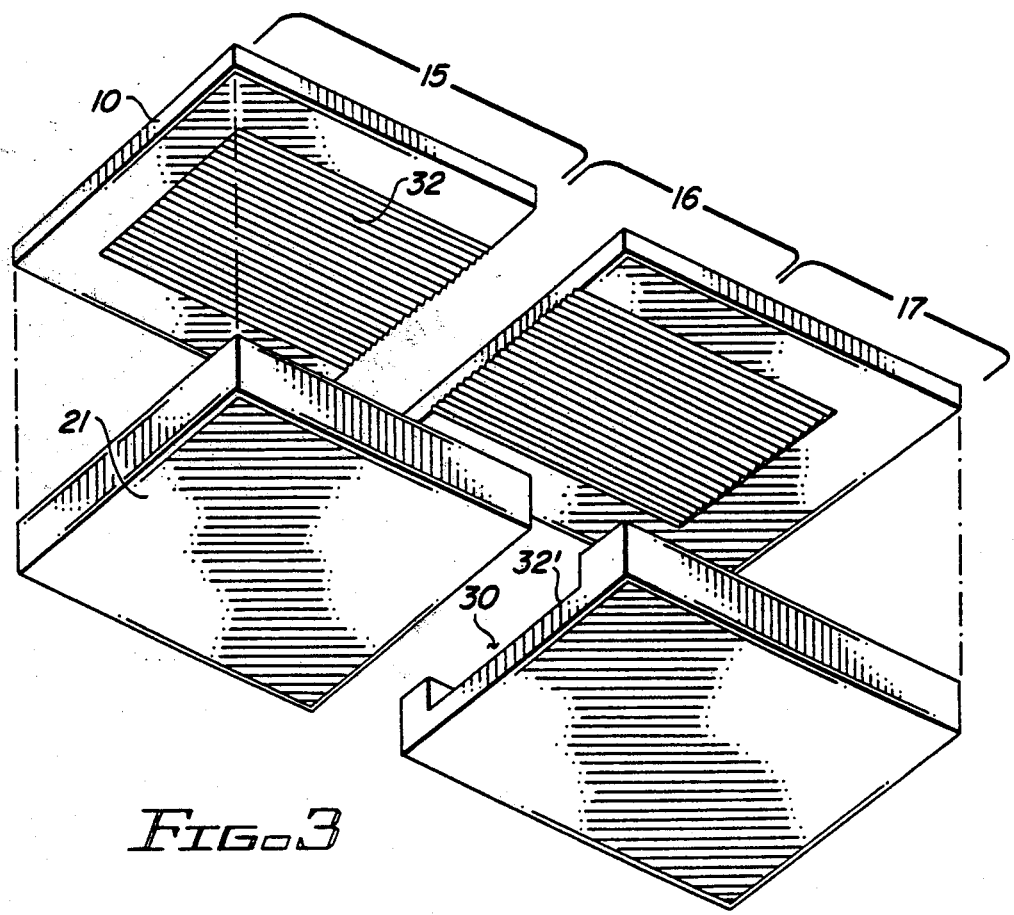
FIG. 3 shows an alternative heat pipe structure.

FIG. 3 shows an alternative construction where the grooves 32 for condensate return are manufactured directly into the copper baseplate 10 which forms the top of the heat pipe assembly. In this configuration there is only one heat pipe in the assembly. Vapor space 30 for the heat pipe is provided by a recessed area manufactured into frame 21. The recessed area in frame 21 mates with the grooved surface of baseplate 10. If desired, grooves 32' may be manufactured into the recessed area of frame 21 to provide additional means for condensate return.

It is also possible to provide the vapor space 30 by manufacturing the recessed area into baseplate 10. If that is done, the grooves 32 should be cut into the baseplate 10 in the recessed area to provide for the efficient transfer of heat from the heat source to the working fluid in the grooves. However, for ease of manufacture, it is preferred to place the recessed area in frame 21, as shown in FIG. 3.

FIG. 4 shows a typical heat pipe for the purpose of explaining heat pipe operation. A vapor space or open area 30 is provided in the heat pipe and the interior surface of the heat pipe 20 is covered with a wick 32. The wick can be a porous material such as sintered metal or metal screen. Alternatively, small grooves, such as shown in FIG. 3, can be used to provide the wicking mechanism for condensate return. The working fluid is encapsulated within the opening 30 by a closure plug 31 permanently bonded to the end of the heat pipe after the working fluid is inserted into the opening 30. In operation, heat from the electronic components will be provided to the heat pipe at an area 16 causing the working fluid inside the wick 32 to evaporate into the vapor space 30. As a consequence, a difference in vapor pressure between the evaporator section 16 and the condenser section 17 results in a flow of the heated vapor toward the condenser end 17 of the heat pipe. As the heated Vapor reaches the condensing area 17, it is cooled and returns to the liquid state. The liquid is then carried back to the evaporator area 16 through the capillary action of a wicking mechanism provided along the interior surface of the heat pipe.

Heat pipes are known in the art and have been used in cooling applications, particularly with respect to the cooling of electronic components. It is desirable to construct heat pipes from materials which are highly thermally conductive, such as copper or aluminum. When copper is the chosen material, water or methanol is usually used as the working fluid. If aluminum is the chosen material for the heat pipe, acetone or ammonia is frequently used as the working fluid. Heat pipes may be of any desired configuration; in the current invention, the desired configuration is a flat heat pipe structure for removing heat from a flat baseplate.

FIG. 5 is an alternative arrangement to the construction shown in FIG. 1 for the circuit board heat pipe assembly. In FIG. 5, copper baseplate 10 extends beyond the dielectric layer 11 which corresponds to the component portion of the board, that is, the evaporating area 16, to a condensing area 15. Fins 18 and 18' are located on either side of the copper baseplate 10 in cooling area 15.

FIG. 6 shows another arrangement in which the circuit card/heat pipe assembly is located within cold walls 40 and 41. The heat pipe structure which includes the copper baseplate 10 and the frame 21 are mounted to the cold walls. Refrigerant flows through the cold walls 40 and 41 in order to remove heat from the circuit card/heat pipe assembly. Evaporator area 16 is shown together with cooling areas 15 and 17. Note that the encapsulated fluid contained within the heat pipe structure does not intermingle with the refrigerant flowing through cold walls 40 and 41. The cold walls represent an alternative cooling arrangement to the cooling fins 18 and 19 shown in FIG. 1.

In the embodiment of the invention shown in FIG. 3, a copper baseplate of appropriate thickness and appropriate dimension is provided and the heat pipe grooves 32 are cut into the flat surface of the baseplate. A closure plate 21, containing a vapor space and which may also contain grooves 32', is bonded or brazed to the baseplate 10 to form a flat heat pipe arrangement encapsulating working fluid within the heat pipe. In the circuit board portion of the assembly, a thin dielectric layer 11 such as epoxy glass is deposited on baseplate 10. A copper layer 12 as shown in FIG. 2, is placed over the epoxy glass layer and etched to provide circuit connections for the surface-mounted components.

In the embodiment shown in FIG. 1, prefabricated heat pipes, such as shown in FIG. 4, may be inserted into frame 21 and held in place by baseplate 10. Also, if desired, mating grooves can be cut into both the frame 21 and the baseplate 10 to provide the heat pipe structure.

While the invention has been described above with respect to specific embodiments, it will be understood by those skilled in the art that various changes in form and detail may be made therein without departing from the spirit and scope of the invention which receives definition in the following claims.

We claim:

1. A metal-backed printed circuit board with electronic components mounted thereon for use in electronic circuits such as power supplies, comprising:
   a metallic flat baseplate for said printed circuit board;
   a flat heat pipe structure including a frame incorporated into direct contact with said baseplate thereby forming an integral circuit board and heat pipe assembly, said heat pipe structure comprised of a plurality of separate linear heat pipes packed side by side in direct physical contact each said heat pipe, having therein an encapsulated working fluid said assembly having an evaporator portion upon which said components are mounted and a cooling portion separate from said evaporator portion, said cooling portion for attachment to a cooling structure, said baseplate and said heat pipe structure extending throughout said evaporator portion and said cooling portion whereby heat generated in said evaporator portion vaporizes said working fluid to move the vaporized fluid through said heat pipe to said cooling portion, where said fluid is returned to a liquid state to move by capillary action through said heat pipe back to said evaporator portion.

2. The circuit board of claim 1 wherein said cooling structure is comprised of a series of fins mounted on said cooling portion of said heat pipe structures.

3. The circuit board of claim wherein said heat pipe structure is comprised of a cold wall located on at least one side of said heat pipe structure and in direct contact therewith.

4. The circuit board of claim 1 wherein said flat heat structure comprises a series of pre-fabricated metallic heat pipes.

5. The circuit board of claim 4 wherein said heat pipe structure is comprised of a series of fins mounted on said cooling portion of said heat pipe structure.

6. The circuit board of claim 4 wherein said heat pipe structure is comprised of a cold wall located on at least one side of said heat pipe structure and in direct contact therewith.

7. The circuit board of claim 1 wherein said flat heat pipe structure includes a series of grooves formed within one side of said flat baseplate, said heat pipes partially filled with said working fluid, sad baseplate bonded to said frame thereby closing said heat pipes and encapsulating said fluid within said heat pipes.

8. The circuit board of claim 7 wherein said heat pipe structure is comprised of a series of fins mounted on said cooling portion of said heat pipe structure.

9. The circuit board of claim 7 wherein said heat pipe structure is comprised of a cold wall located on at least one side of said heat pipe structure and in direct contact therewith.

* * * * *